US008852341B2

(12) United States Patent
Letts et al.

(10) Patent No.: US 8,852,341 B2
(45) Date of Patent: Oct. 7, 2014

(54) METHODS FOR PRODUCING GAN NUTRIENT FOR AMMONOTHERMAL GROWTH

(75) Inventors: Edward Letts, Buellton, CA (US);
Tadao Hashimoto, Santa Barbara, CA (US); Masanori Ikari, Santa Barbara, CA (US)

(73) Assignee: Sixpoint Materials, Inc., Buellton, CA (US)

( * ) Notice: Subject to any disclaimer, the term of this patent is extended or adjusted under 35 U.S.C. 154(b) by 1238 days.

(21) Appl. No.: 12/624,006

(22) Filed: Nov. 23, 2009

(65) Prior Publication Data

US 2010/0126411 A1    May 27, 2010

Related U.S. Application Data

(60) Provisional application No. 61/200,211, filed on Nov. 24, 2008.

(51) Int. Cl.
| | |
|---|---|
| C30B 25/02 | (2006.01) |
| C30B 25/00 | (2006.01) |
| C30B 29/40 | (2006.01) |
| C01B 21/06 | (2006.01) |
| C30B 7/10 | (2006.01) |

(52) U.S. Cl.
CPC ............. C30B 29/403 (2013.01); C30B 25/005 (2013.01); C30B 29/406 (2013.01); C01B 21/0632 (2013.01); C30B 25/00 (2013.01); C30B 7/10 (2013.01)
USPC .................. 117/86; 117/90; 117/94; 117/104

(58) Field of Classification Search
USPC ................................ 117/86, 952, 90, 94, 104
See application file for complete search history.

(56) References Cited

U.S. PATENT DOCUMENTS

| | | | |
|---|---|---|---|
| 2,962,838 | A | 12/1960 | Kebler et al. |
| 5,942,148 | A | 8/1999 | Preston |
| 6,117,213 | A | 9/2000 | Ueda et al. |
| 6,156,581 | A | 12/2000 | Vaudo et al. |
| 6,177,057 | B1 | 1/2001 | Purdy |
| 6,177,059 | B1 | 1/2001 | Matsuda et al. |

(Continued)

FOREIGN PATENT DOCUMENTS

| | | |
|---|---|---|
| EP | 0827192 | 4/1998 |
| EP | 1041610 | 4/2000 |

(Continued)

OTHER PUBLICATIONS

U.S. Appl. No. 12/456,181 Office Action Sep. 4, 2012.

(Continued)

Primary Examiner — Bob M Kunemund
(74) Attorney, Agent, or Firm — K&L Gates, LLP

(57) ABSTRACT

The present invention discloses methods to produce large quantities of polycrystalline GaN for use in the ammonothermal growth of group III-nitride material. High production rates of GaN can be produced in a hydride vapor phase growth system. One drawback to enhanced polycrystalline growth is the increased incorporation of impurities, such as oxygen. A new reactor design using non-oxide material that reduces impurity concentrations is disclosed. Purification of remaining source material after an ammonothermal growth is also disclosed. The methods described produce sufficient quantities of polycrystalline GaN source material for the ammonothermal growth of group III-nitride material.

37 Claims, 2 Drawing Sheets

(56) References Cited

U.S. PATENT DOCUMENTS

| | | | |
|---|---|---|---|
| 6,316,785 B1 | 11/2001 | Nunoue et al. | |
| 6,326,313 B1 | 12/2001 | Couteau et al. | |
| 6,398,867 B1 | 6/2002 | D'Evelyn et al. | |
| 6,406,540 B1 | 6/2002 | Harris | |
| 6,441,393 B2 | 8/2002 | Goetz et al. | |
| 6,569,238 B2 | 5/2003 | Ishida | |
| 6,596,079 B1 | 7/2003 | Vaudo et al. | |
| 6,656,615 B2 | 12/2003 | Dwilinski et al. | |
| 7,017,514 B1 | 3/2006 | Shepherd et al. | |
| 7,033,439 B2 | 4/2006 | Shibata et al. | |
| 7,078,731 B2 | 7/2006 | D'Evelyn et al. | |
| 7,132,730 B2 | 11/2006 | Dwilinski et al. | |
| 7,160,388 B2 | 1/2007 | Dwiliński et al. | |
| 7,169,227 B2 | 1/2007 | Maruska et al. | |
| 7,170,095 B2 | 1/2007 | Vaudo et al. | |
| 7,303,632 B2 | 12/2007 | Negley | |
| 7,368,015 B2 | 5/2008 | D'Evelyn et al. | |
| 7,589,000 B2 | 9/2009 | Kasai et al. | |
| 7,749,325 B2 | 7/2010 | Nakayama | |
| 7,847,313 B2 | 12/2010 | Shibata | |
| 8,092,597 B2 * | 1/2012 | Dmitriev et al. | 117/99 |
| 8,236,267 B2 | 8/2012 | Hashimoto et al. | |
| 8,337,798 B2 | 12/2012 | Sarayama et al. | |
| 8,357,243 B2 | 1/2013 | Hashimoto et al. | |
| 8,420,041 B2 | 4/2013 | Hashimoto et al. | |
| 2002/0078881 A1 | 6/2002 | Cuomo et al. | |
| 2002/0144645 A1 | 10/2002 | Kim et al. | |
| 2002/0177312 A1 | 11/2002 | Tsvetkov et al. | |
| 2002/0192507 A1 | 12/2002 | Dwilinski et al. | |
| 2003/0024475 A1 | 2/2003 | Anderson | |
| 2004/0051105 A1 | 3/2004 | Tsuda et al. | |
| 2004/0072383 A1 | 4/2004 | Nagahama et al. | |
| 2004/0124434 A1 | 7/2004 | D'Evelyn et al. | |
| 2004/0226588 A1 | 11/2004 | Onishi et al. | |
| 2004/0245535 A1 | 12/2004 | D'Evelyn et al. | |
| 2004/0261692 A1 | 12/2004 | Dwilinski et al. | |
| 2004/0262630 A1 | 12/2004 | Kitaoka et al. | |
| 2005/0053513 A1 | 3/2005 | Pike, Jr. | |
| 2005/0059229 A1 | 3/2005 | Minemoto et al. | |
| 2005/0098095 A1 | 5/2005 | D'Evelyn et al. | |
| 2005/0121688 A1 | 6/2005 | Nagai et al. | |
| 2005/0126471 A1 | 6/2005 | Jenny et al. | |
| 2005/0142391 A1 | 6/2005 | Dmitriev et al. | |
| 2005/0161697 A1 | 7/2005 | Nakahata et al. | |
| 2005/0166835 A1 | 8/2005 | Koukitsu et al. | |
| 2005/0224783 A1 | 10/2005 | Matsuyama et al. | |
| 2005/0258451 A1 | 11/2005 | Saxler et al. | |
| 2006/0037530 A1 | 2/2006 | Dwilinski et al. | |
| 2006/0054076 A1 | 3/2006 | Dwilinski et al. | |
| 2006/0057749 A1 | 3/2006 | Dwilinski et al. | |
| 2006/0118799 A1 | 6/2006 | D'Evelyn et al. | |
| 2006/0191472 A1 | 8/2006 | Dwilinski et al. | |
| 2006/0210800 A1 | 9/2006 | Spitsberg et al. | |
| 2006/0213430 A1 | 9/2006 | Jenny et al. | |
| 2006/0255341 A1 | 11/2006 | Pinnington et al. | |
| 2006/0280668 A1 | 12/2006 | Dmitriev et al. | |
| 2006/0282229 A1 | 12/2006 | Kim et al. | |
| 2007/0012242 A1 | 1/2007 | Jurisch et al. | |
| 2007/0032046 A1 | 2/2007 | Dmitriev et al. | |
| 2007/0084399 A1 | 4/2007 | Sarayama et al. | |
| 2007/0157876 A1 | 7/2007 | Minemoto et al. | |
| 2007/0158785 A1 | 7/2007 | D'Evelyn et al. | |
| 2007/0181056 A1 | 8/2007 | D'Evelyn et al. | |
| 2007/0218703 A1 | 9/2007 | Kaeding et al. | |
| 2007/0234946 A1 | 10/2007 | Hashimoto et al. | |
| 2007/0240630 A1 | 10/2007 | Leonard et al. | |
| 2007/0252164 A1 | 11/2007 | Zhong et al. | |
| 2007/0290230 A1 | 12/2007 | Kawaguchi et al. | |
| 2008/0001165 A1 | 1/2008 | Hashimoto et al. | |
| 2008/0006844 A1 | 1/2008 | D'Evelyn et al. | |
| 2008/0008855 A1 | 1/2008 | D'Evelyn et al. | |
| 2008/0102016 A1 | 5/2008 | Hashimoto | |
| 2008/0111144 A1 | 5/2008 | Fichtenbaum et al. | |
| 2008/0118733 A1 | 5/2008 | Oshima | |
| 2009/0256240 A1 | 10/2009 | Hashimoto et al. | |
| 2009/0309105 A1 | 12/2009 | Letts et al. | |
| 2009/0315151 A1 | 12/2009 | Hashimoto et al. | |
| 2010/0068118 A1 | 3/2010 | Hashimoto et al. | |
| 2010/0095882 A1 | 4/2010 | Hashimoto et al. | |
| 2010/0213576 A1 | 8/2010 | Hiranaka | |
| 2010/0285657 A1 | 11/2010 | Hashimoto et al. | |
| 2013/0119399 A1 | 5/2013 | Hashimoto et al. | |
| 2013/0135005 A1 | 5/2013 | Hashimoto et al. | |
| 2013/0206057 A1 | 8/2013 | Hashimoto et al. | |

FOREIGN PATENT DOCUMENTS

| | | |
|---|---|---|
| EP | 1 110 600 A2 | 6/2001 |
| EP | 1 818 429 A2 | 8/2007 |
| JP | 50/109896 | 8/1975 |
| JP | 10-125753 | 5/1998 |
| JP | 2001/102307 | 4/2001 |
| JP | 2002/261014 A | 9/2002 |
| JP | 2004-002152 | 8/2004 |
| JP | 2004-284876 | 10/2004 |
| JP | 2005-008444 | 1/2005 |
| JP | 2005-288350 | 10/2005 |
| JP | 2006/069827 | 3/2006 |
| JP | 2006-509708 | 3/2006 |
| JP | 2006/193355 | 7/2006 |
| JP | 2007/238346 | 9/2007 |
| JP | 2007/238347 | 9/2007 |
| JP | 2007/262815 | 10/2007 |
| JP | 2007-290921 | 11/2007 |
| JP | 2008/501600 | 1/2008 |
| JP | 2008/127252 | 6/2008 |
| JP | 2013-126945 | 6/2013 |
| WO | WO 99/23693 | 5/1999 |
| WO | WO 03-035945 A2 | 5/2003 |
| WO | WO-2004-003261 A1 | 1/2004 |
| WO | WO 2004/053206 | 6/2004 |
| WO | WO 2004-061923 A1 | 7/2004 |
| WO | WO 2006-057463 A1 | 6/2006 |
| WO | WO 2006-080959 A1 | 8/2006 |
| WO | WO 2007/008198 A1 | 1/2007 |
| WO | WO 2007-008198 A1 | 1/2007 |
| WO | WO 2007-078844 A2 | 7/2007 |
| WO | WO 2007-117689 A2 | 10/2007 |
| WO | WO 2007/117689 A2 | 10/2007 |
| WO | WO 2007-133512 A2 | 11/2007 |
| WO | WO 2007-149487 A2 | 12/2007 |
| WO | WO 2008-051589 A2 | 5/2008 |
| WO | WO 2008/064109 A2 | 5/2008 |
| WO | WO 2009-039398 A1 | 3/2009 |
| WO | WO 2009/047894 | 4/2009 |
| WO | WO 2009-108700 A1 | 9/2009 |
| WO | WO 2009-149299 A1 | 12/2009 |
| WO | WO 2009-149300 A1 | 12/2009 |
| WO | WO 2009-151642 A1 | 12/2009 |
| WO | WO 2010-045567 A1 | 4/2010 |
| WO | WO 2010-060034 A1 | 5/2010 |

OTHER PUBLICATIONS

U.S. Appl. No. 12/456,181 Amendment Sep. 26, 2012.
U.S. Appl. No. 12/456,181 Notice of Allowance Oct. 29, 2012.
U.S. Appl. No. 12/455,760 Office Action Nov. 23, 2011.
U.S. Appl. No. 12/455,760 Amendment Mar. 23, 2012.
U.S. Appl. No. 12/455,760 Office Action Oct. 12, 2012.
U.S. Appl. No. 12/392,960 Office Action Dec. 13, 2011.
U.S. Appl. No. 12/392,960 Amendment Mar. 13, 2012.
U.S. Appl. No. 12/392,960 Office Action Aug. 24, 2012.
U.S. Appl. No. 12/455,683 Office Action Apr. 26, 2011.
U.S. Appl. No. 12/455,683 Office Action Oct. 13, 2011.
U.S. Appl. No. 12/455,683 Amendment Feb. 13, 2012.
U.S. Appl. No. 12/455,683 Notice of Allowance Mar. 15, 2012.
U.S. Appl. No. 12/455,683 Amendment Jul. 26, 2011.
Jacobson, Loren A., Crystal Symmetries, METE 327: Physical Metallurgy, Department of Material and Metallurgical Engineering, New Mexico Institute of Mining and Technology (May 16, 2008).
Schineller, B., et al. "Vertical—HVPE as a Production Method for Free-Standing GaN-Substrates", CS Mantech Conference, May

(56) References Cited

OTHER PUBLICATIONS 14-17, 2007 Austin TX [USA]; [Online] 07A, May 14, 2007, pp. 123-126, XP002592188; URL:http://www.gaasmantech.org/Digests/2007/2007%20Papers/07a.pdf.
PCT/US2009/003557, International Preliminary Report on Patentability dated Dec. 14, 2010 and Written Opinion, pp. 8.
EP09762938.0 Amendment dated Oct. 9, 2012.
EP09762938.0 Office Action dated May 30, 2012.
JP2010548751 (Japanese and English translation) Office Action dated Sep. 4, 2012.
PCT/US2009/046316 International Preliminary Report on Patentability dated Dec. 6, 2010 and Written Opinion, pp. 13.
JP2010540956 Office Action dated Aug. 14, 2012.
PCT/US09/061022 International Preliminary Report on Patentability dated Apr. 19, 2011 and Written Opinion, pp. 6.
JP2010188936 Office Action (Japanese and English translation) dated Sep. 4, 2012.
JP2010188935 Office Action (Japanese and English translation) dated Sep. 4, 2012.
JP2010188934 Office Action (Japanese and English translation) dated Sep. 4, 2012.
JP2010548951 Office Action (Japanese and English translation) dated Sep. 4, 2012.
PCT/US2009/046317 International Preliminary Report on Patentability dated Dec. 6, 2010 and Written Opinion, pp. 9.
PCT/US2009/065513 International Preliminary Report on Patentability dated May 24, 2011 and Written Opinion, pp. 8.
PCT/US2010/033790 International Search Report, dated Oct. 26, 2010, pp. 6.
PCT/US2009/035140, WO International Search Report dated May 29, 2009, pp. 4.
PCT/US2009/035140, WO Written Opinion dated May 29, 2009, pp. 6.
PCT/US2009/035140, WO International Preliminary Report on Patentability dated Mar. 17, 2010, pp. 8.
PCT/US2009/046316, WO International Search Report and Written Opinion dated Oct. 22, 2009, pp. 18.
PCT/US2009/061022, WO International Search Report and Written Opinion dated Jan. 21, 2010, pp. 10.
PCT/US2009/003557, WO International Search Report dated Oct. 26, 2009 pp. 4.
PCT/US2009/046317, WO International Search Report and Written Opinion, dated Sep. 25, 2009 pp. 15.
PCT/US2009/065513, WO International Search Report and Written Opinion, dated Feb. 3, 2010; pp. 15.
Aoki, M., et al., "GaN single crystal growth using high-purity Na as a flux," Journal of Crystal Growth, 2002, pp. 70-76; 242; Elsevier, www.elsevier.com/locate/jcrysgro.
Bliss, D. F., et al., "Aluminum nitride substrate growth by halide vapor transport epitaxy," Journal of Crystal Growth, 2003, pp. 1-6, vol. 250; Elsevier, www.elsevier.com/locate/jcrysgro.
Callahan, Michael J., et al "Growth of GaN crystals under ammonothermal conditions," Material Research Society, vol. 798, 2004, pp. YS.10.1-Y2.10.6.
Callahan, M., et al., "Gan single crystals grown on HVPE seeds in alkaline supercritical ammonia," J Mater Sci, 2006, pp. 1399-1407, 41.
Chen, Q. S., et al., "Modeling of ammonothermal growth of nitrides," Journal of Crystal Growth, 2003, pp. 181-187, 258; Elsevier, www.elsevier.com/locate/jcrysgro.
Dwilinski, R., et al., "AMMONO method of BN, AlN, and GaN synthesis and crystal growth," MRS Internet Journal of Nitride Semiconductor Research, 1998, pp. 1-4; 3, 25.
Dwilinski, R., et al., AMMONO method of GaN and AlN production, Diamond and Related Materials, 1998, pp. 1348-1350, 7; Elsevier.
Dwilinski, R., et al., "On GAN Crystallization by Ammonothermal Method," Acta Physica Polonica A, 1996, pp. 763-766, No. 4, vol. 90.
Dwilinski, R., et al., "Excellent crystallinity of truly bulk ammonothermal GaN," Journal of Crystal Growth, 2008, pp. 3911-3916, 310; Elsevier, www.elsevier.com/locate/jcrysgro.
Ehrentraut, Dirk., et al., Reviewing recent development in the acid ammonthermal crystal growth of gallium nitride, Journal of Crystal Growth, 2008, pp. 3902-3906, 310; Elsevier, www.elsevier.com/locate/jcrysgro.
Etzkorn, E. V., et al. "Cracking of GaN Films" Journal of Applied Physics, Jan. 15, 2001, pp. 1025-1034, vol. 89, No. 2, XP001011762, American Institute of Physics.
Hashimoto, Tadao et al. "A GaN bulk crystal with improved structural quality grown by the ammonothermal method," Published online: Jul. 2007; Nature Materials Advance Online Publication www.nature.com/naturematerials; pp. 1-3.
Hashimoto, Tadao et al. "Ammonothermal growth of GaN utilizing negative temperature dependence of solubility in basic ammonia" Mater. Res. Soc. Symp. Proc., 2005, pp. E2.8.1.-E.2.8.6., vol. 831, Materials Research Society.
Hashimoto, Tadao et al. "Growth of Bulk GaN Crystals by the Basic Ammonothermal Method," Japanese Journal of Applied Physics, 2007, pp. L889-L891, vol. 46, No. 37, The Japanese Society of Applied Physics, JJAP Express Letter.
Hashimoto, Tadao et al. "Growth of bulk GaN with Low Dislocation Density by the Ammonothermal Method Using Polycrystalline GaN Nutrient" Japanese Journal of Applied Physics, 2007, pp. L525-L527, vol. 46, No. 22, The Japanese Society of Applied Physics, JJAP Express Letter.
Hashimoto, Tadao et al. "Growth of gallium nitride via fluid transport in supercritical ammonia," Journal of Crystal Growth, 2005, pp. e525-e530; 275, Elsevier, www.elsevier.com/locate/jcrysgro.
Hashimoto, Tadao et al. "Phase selection of microcrystalline GaN synthesized in supercritical ammonia" Journal of Crystal Growth, 2006, pp. 100-106; 291, Elsevier, www.elsevier.com/iocate/jcrysgro.
Hashimoto, Tadao et al. "Seeded growth of GaN by the basic ammonothermal method" Journal of Crystal Growth, 2007, pp. 311-316; 305, Elsevier, www.elsevier.com/locate/jcrysgro.
Hashimoto, Tadao et al. "Status and perspectives of the ammonothermal growth of GaN substrates" Journal of Crystal Growth, 2008, pp. 876-880; 310, Elsevier, www.elsevier.com/locate/jcrysgro.
Hashimoto, Tadao et al. "Structural Characterization of Thick GaN Films Grown of Free-Standing GaN Seeds by the Ammonothermal Method Using Basic Ammonia," Japanese Journal of Applied Physics, 2005, pp. L 797-L 799, vol. 44, No. 25, The Japan Society of Applied Physics, JJAP Express Letter.
Hashimoto, Tadao et al., "Ammonothermal growth of bulk GaN," Journal of Crystal Growth, 2008, pp. 3907-3910; 310; Elsevier, www.elsevier.com/locate/jcrysgro.
Hashimoto, Tadao et al., "Ammonothermal Growth of GaN on an over-1-inch Seed Crystal," Japanese Journal of Applied Physics, 2005, pp. L 1570-L 1572, vol. 44, No. 52, The Japan Society of Applied Physics, JJAP Express Letter.
Inoue, T., et al., "Pressure-Controlled Solution Growth of Bulk GaN Crystals under High Pressure," 2001, pp. 15-27; 223, 15, Phys. Stat. Sol. (b).
Iwahashi, et al., "Effects of ammonia gas on threshold pressure and seed growth for bulk GaN single crystals by Na flux method," Journal of Crystal Growth, 2003, pp. 1-5, 253; Elsevier, www.elsevier.com/locate/jcrysgro.
Ketchum, Douglas R., et al. "Crystal growth of gallium nitride in supercritical ammonia," Journal of Crystal Growth, 2001, pp. 431-434, 222; Elsevier, www.elsevier.nl/locate/jcrysgro.
Kumagai, Y., et al., "Growth of thick AlN layers by hydride vapor phase epitaxy," Journal Crystal Growth, 2005, pp. 62-67, vol. 281; Elsevier, www.elsevier.com/locate/jcrysgro.
Kumagai, Y., et al., "Hydride vapor phase epitaxy of AlN: thermodynamic analysis of aluminum source and its application to growth," Phys. Stat. Sol. ( c), 2003, pp. 2498-2501, vol. 0, No. 7.
Ledyaev, O., et al., Properties of AlN Layers Grown on SiC Substrates in Wide Temperature Range by HVPE, Phys. Stat. Sol. ( c) ,2002, pp. 474-478, No. 1.
Ohshima, E., et al., "Growth of the 2-in-size bulk ZnO single crystals by the hydrothermal method," Journal of Crystal Growth, 2004, pp. 166-170, 260; Elsevier, www.elsevier.com/locate/jcrysgro.
Peters, D. et al., "Ammonothermal Synthesis of Aluminum Nitride," Journal of Crystal Growth, 1990, pp. 411-418, 104.

(56) References Cited

OTHER PUBLICATIONS

Porowski. S., "Near Defect Free GaN Substrates," MRS Internet Journal of Nitride Semiconductors, Res. 4S1, 1999, G1.3.
Purdy, A. P., et al. "Ammonothermal Recrystallization of Gallium Nitride with Acidic Mineralizers," Cyst. Growth Design, 2002, pp. 141-145, vol. 2, No. 2.
Ramachandran, V. et al., "Inversion of wurtzite GaN(0001) by exposure to magnesium," Applied Physics Letters, Aug. 9, 1999, pp. 808-810, vol. 75, No. 6.
Wu, H. et al., "Rapid Synthesis of High Purity GaN Powder," Phys. Stat. Sol. (c), 2005, pp. 2074-2078, New York.
Yamane, Y. , et al., "Growth of thick AlN layer on sapphire (0001) substrate using hydride vapor phase epitaxy," Phys. Stat. Sol. ( c), 2005, pp. 2062-2065, vol. 2, No. 7.
U.S. Appl. No. 12/580,849 Amendment dated Jun. 3, 2013.
U.S. Appl. No. 12/455,760 Office Action Jun. 6, 2013.
U.S. Appl. No. 13/728,769 Office Action dated May 23, 2013.
U.S. Appl. No. 12/392,960 amendment Jun. 18, 2013.
U.S. Appl. No. 13/728,769 Terminal Disclaimer and Amendment dated Aug. 13, 2013.
U.S. Appl. No. 13/728,799 Notice of Allowance dated Aug. 15, 2013.
U.S. Appl. No. 13/728,769 Notice of Allowance dated Sep. 13, 2013.
U.S. Appl. No. 12/774,677 Office Action dated Sep. 27, 2013.
U.S. Appl. No. 12/392,960 Office Action Oct. 25, 2013.
JP20100188934 Amendment (Japanese and English translation) dated Aug. 13, 2013.
JP2010548951 Amendment (Japanese and English translation) dated Aug. 13, 2013.
Wang, Buguo et al., "Ammonothermal Growth of GaN Crystals in Alkaline Solutions" Journal of Crystal Growth, Jan. 2006; pp. 376-380; vol. 287.
U.S. Appl. No. 12/392,960 Amendment Dec. 21, 2012.
U.S. Appl. No. 12/392,960 Office Action Apr. 9, 2013.
U.S. Appl. No. 12/455,760 Amendment filed Apr. 11, 2013.
U.S. Appl. No. 12/580,849 Office Action dated Mar. 1, 2013.
U.S. Appl. No. 13/491,392 Notice of Allowance dated Dec. 3, 2012.
EP09759458.4 Amendment dated Apr. 30, 2013.
JP2010188934 Amendment (Japanese and English translation) dated Mar. 7, 2013.
JP20100188935 Amendment (Japanese and English translation) dated May 7, 2013.
JP20100188936 Amendment (Japanese and English translation) dated Mar. 7, 2013.
JP2010540956 JP and English translation, Amendment dated Feb. 18, 2013.
JP2010540956 JP, Notice of Allowance dated Mar. 18, 2013.
JP20100540958 Amendment filed Dec. 21, 2012.
JP2010540958 Office Action, Japanese with English translation, Jan. 21, 2013.
JP2010548751 (Japanese and English translation) Amendment dated Jan. 7, 2013.
JP2010548751 (Japanese and English translation) Office Action mailed Mar. 15, 2013.
JP2010548951 Amendment (Japanese and English translation) dated Mar. 7, 2013.
JP2010548951 Office Action (Japanese) dated May 14, 2013.
JP2010188934 Office Action (Japanese) dated May 14, 2013.

* cited by examiner

METHODS FOR PRODUCING GAN NUTRIENT FOR AMMONOTHERMAL GROWTH

CROSS REFERENCE TO RELATED APPLICATIONS

This application claims priority under 35 U.S.C. §119 to U.S. Provisional Application Ser. No. 61/200,211, filed Nov. 24, 2008, the disclosure of which is incorporated in its entirety by this reference. This application is further related to the following U.S. and PCT patent applications:

PCT Utility Patent Publication No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS";

U.S. Utility patent application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY";

U.S. Utility patent application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS";

U.S. Utility patent application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH";

U.S. Utility patent application Ser. No. 61/058,910, filed on June 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL";

U.S. Utility patent application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA"; and U.S. Utility patent application Ser. No. 12/580,849, filed Oct. 16, 2009 by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,", which application claims the benefit under 35 U.S.C. §119(e) of U.S. Utility patent application Ser. No. 61/106,110, filed on Oct. 16, 2008, by Tadao Hashimoto, Masanori Ikari, Edward Letts, entitled "DESIGN OF FLOW-RESTRICTING DEVICE IN THE HIGH-PRESSURE VESSEL FOR GROWING GROUP III NITRIDE CRYSTALS AND METHOD OF GROWING GROUP III NITRIDE CRYSTALS"; and PCT Application Serial No. PCT/US2009/65513, filed Nov. 23, 2009, by Tadao Hashimoto, Edward Letts, and Masanori Ikari, entitled "METHODS FOR PRODUCING GaN NUTRIENT FOR AMMONOTHERMAL GROWTH,";

which applications are incorporated by reference herein in their entirely as if put forth in full below.

BACKGROUND

1. Field of the Invention

The invention is related to a production method of polycrystalline GaN for use as a nutrient or source material in the ammonothermal method. Design of the reactor material to control impurities while producing high yields is discussed.

2. Description of the Existing Technology

Gallium nitride (GaN) and its related group III alloys are the key material for various opto-electronic and electronic devices such as light emitting diodes (LEDs), laser diodes (LDs), microwave power transistors, and solar-blind photo detectors. Currently LEDs are widely used in cell phones, indicators, displays, and LDs are used in data storage disc drives. The majority of these devices are grown epitaxially on heterogeneous substrates, such as sapphire and silicon carbide. The heteroepitaxial growth of group III-nitride causes highly defected or even cracked films, which hinders the realization of high-end optical and electronic devices, such as high-brightness LEDs for general lighting or high-power microwave transistors.

Most of the problems inherent in heteroepitaxial growth could be avoided by instead using homoepitaxial growth. Single crystalline group III-nitride wafers can be sliced from bulk group III-nitride crystal ingots and then utilized for high-end homoepitaxial growth of optical and electronic devices. For the majority of devices, single crystalline GaN wafers are favorable because it is relatively easy to control the conductivity of the wafer and GaN wafers will provide the smallest lattice/thermal mismatch with device layers. However, the GaN wafers needed for homogenous growth are currently expensive compared to heteroepitaxial substrates. It has been difficult to grow group III-nitride crystal ingots due to their high melting point and high nitrogen vapor pressure at high temperature. Growth methods using molten Ga, such as high-pressure high-temperature synthesis (S. Porowski, *MRS Internet Journal of Nitride Semiconductor*, Res. 4S1, (1999), G1.3; and T. Inoue, et al., *Phys. Stat. Sol.* (b), 223, (2001), 15) and sodium flux (M. Aoki et al., *J. Cryst. Growth*, 242, (2002) 70; and T. Iwahashi, et al., *J. Cryst. Growth*, 253, (2003), 1), have been proposed to grow GaN crystals. Nevertheless the crystal shape grown using molten Ga is a thin platelet because molten Ga has low solubility of nitrogen and a low diffusion coefficient of nitrogen.

The ammonothermal method is a promising alternative growth method that has been used to achieve successful growth of real bulk GaN ingots (T. Hashimoto, et al., *Jpn. J. Appl. Phys.*, 46, (2007), L889). Ammonothermal growth has the potential for growing large GaN crystal ingots because its solvent, high-pressure ammonia, has advantages as a fluid medium including high transport speed and solubility of the source materials, such as GaN polycrystals or metallic Ga.

State-of-the-art ammonothermal method (U.S. Pat. No. 6,656,615; International Application Publication Nos. WO 2007/008198; and WO 2007/117689; and U.S. Application Publication No. 2007/0234946) requires a sufficient supply of source material. While pure Ga metal can be used as a source material, it provides an uneven growth rate as the surface of the Ga nitridizes. To provide a more stable growth rate, polycrystalline GaN is desirable. One method to produce GaN polycrystals is direct nitridization of Ga with ammonia (H. Wu, et al., Phys. Stat. Sol. (c), 2 No. 7, (2005), 2074). Nevertheless, this method can only yield powder form of GaN (i.e. microcrystalline or nanocrystalline). On the other hand, GaN polycrystals obtained as a parasitic deposition during hydride vapor phase epitaxy (HVPE) show large grains with partially faceted surfaces. The parasitic GaN polycrystals in HVPE are in the suitable shape for ammonothermal nutrients; however, since HVPE are designed to minimize polycrystalline deposits and to improve epitaxial growth, the production yield of the GaN polycrystals is very low. Thus, using parasitic GaN polycrystals in HVPE as ammonothermal nutrient is not practical for mass production of bulk GaN. A method to produce large quantities of polycrystalline source material would improve the feasibility to scale the ammonothermal growth and facilitate large-scale production of high-end GaN ingots.

All references cited herein are incorporated in their entirety by this reference.

SUMMARY OF THE INVENTION

The present disclosure describes methods and reactor designs for growing polycrystalline group III nitride, such as polycrystalline gallium nitride (GaN). The polycrystalline group III nitride material is suitable for use in the formation of single-crystal group III nitride ingots.

According to a first embodiment, the present disclosure provides a method of producing polycrystalline group III nitride. The method comprises contacting a gaseous hydrogen halide with a group III element source material in a first heated region to produce a group III halide gas, contacting the group III halide gas with ammonia gas in a growth region, and producing a crystalline group III nitride, wherein greater than 80% of the total produced group III nitride is polycrystalline group III nitride. In specific embodiments, the group III element may be gallium.

According to another embodiment, the present disclosure provides a method for recycling polycrystalline GaN source material used in a previous ammonothermal growth process. The method comprises heating and maintaining the polycrystalline GaN source material at a temperature greater than 700° C., back etching a surface of the polycrystalline GaN source material to provide a back etched polycrystalline GaN, and depositing additional polycrystalline GaN on the surface of the back etched polycrystalline GaN by a hydride vapor phase growth process.

Still other embodiments of the present disclosure provide a reactor for growing polycrystalline GaN. The reactor comprises a first heated region comprising a first gas inlet configured to introduce a nitrogen-containing gas, a second heated region comprising a second gas inlet configured to introduce a halide-containing gas, wherein the first heated region and the second heated region are configured to maintain separation of the gases in each region, and a growth region in gaseous contact with the first heated region and the second heated region and configured to allow growth of polycrystalline GaN.

Another embodiment of the present disclosure provides a method for forming single-crystal GaN. The method comprises forming a polycrystalline GaN by a hydride vapor phase growth process, utilizing the polycrystalline GaN as the gallium source material in an ammonothermal crystal growth process, and forming single-crystal GaN by the ammonothermal crystal growth process.

BRIEF DESCRIPTION OF THE DRAWINGS

Referring now to the drawings in which like reference numbers represent corresponding parts throughout.

DETAILED DESCRIPTION OF THE INVENTION

Figure 1:
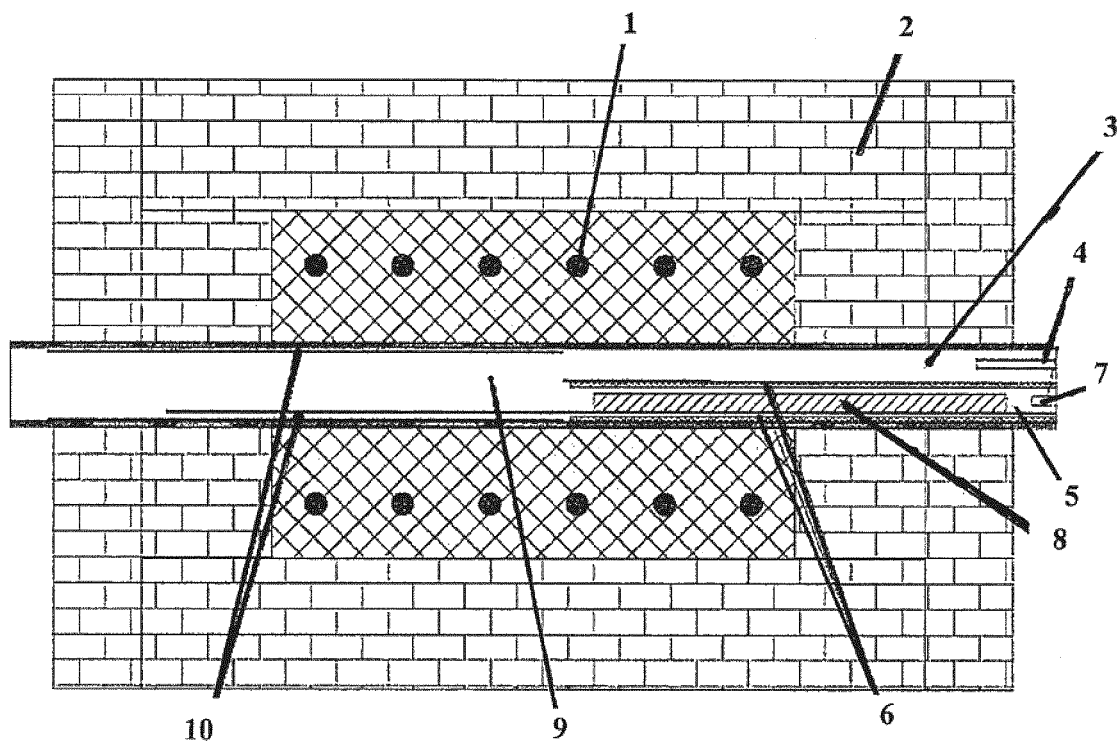
FIG. 1 illustrates a schematic drawing of HVPG reactor according to one embodiment of the present disclosure.

The present disclosure provides methods for growing polycrystalline group III nitride material suitable for use as a group III nitride source material in formation of single-crystal group III nitride compositions, for example by an ammonothermal growth process. The methods of the present disclosure also allow for recycling of polycrystalline group III nitride materials remaining after an ammonothermal growth process. Reactors designed for growing polycrystalline group III nitride material are also disclosed.

Other than the operating examples, or where otherwise indicated, all numbers expressing quantities of ingredients, processing conditions and the like used in the specification and claims are to be understood as being modified in all instances by the term "about". Accordingly, unless indicated to the contrary, the numerical parameters set forth in the following specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the disclosure are approximations, the numerical values set forth in the specific examples are reported as precisely as possible. Any numerical values, however, may contain certain errors, such as, for example, equipment and/or operator error, necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of less than or equal to 10.

Any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

The present disclosure describes several different features and aspects of the invention with reference to various exemplary non-limiting embodiments. It is understood, however, that the invention embraces numerous alternative embodiments, which may be accomplished by combining any of the different features, aspects, and embodiments described herein in any combination that one of ordinary skill in the art would find useful.

The present invention provides a method of producing polycrystalline GaN suitable for use as a nutrient or source material for the ammonothermal growth of group III-nitride wafers, primarily group III-nitride single crystalline wafers that include at least the element Ga with the possible addition of another group III elements B, Al, and In, such as $Al_xGa_{1-x}N$ or $In_xGa_{1-x}N$ ($0 \leq x < 1$), or $Al_xIn_yGa_{1-x-y}N$ ($0 < x < 1$, $0 < y < 1$). The group III-nitride wafers or ingots are grown by the ammonothermal method which utilizes high-pressure $NH_3$ as a fluid medium, nutrient containing group III elements, and seed crystals that are group III-nitride single crystals. The high-pressure $NH_3$ provides high solubility of the nutrient and high transport speed of dissolved precursors. The ammonothermal growth requires the steady supply of a nutrient, such as Ga metal or GaN. A GaN source has the benefit of providing improved growth rate stability compared to Ga metal. One particularly useful GaN source material is polycrystalline GaN.

The Hydride Vapor Phase Epitaxy (HVPE) method has widely been used to produce high quality single crystal GaN with low impurity concentrations. However, the traditional HVPE method is not a practical method to produce large quantities of polycrystalline GaN that may itself be used to grow single-crystal GaN, for example, by an ammonothermal growth process. HVPE traditionally minimizes polycrystalline deposits that can hamper the desired single crystal growth, i.e. HVPE reactor is not designed to grow polycrystalline GaN at fast growth rate. Also, using single crystalline GaN grown by HVPE as the ammonothermal nutrient is not practical since the growth rate of single crystalline GaN is significantly slower than that of polycrystalline GaN. The present disclosure provides a modification of the HVPE setup and a method in which the traditionally desired epitaxy is removed and the reactor design is instead optimized to produce a high yield of polycrystalline GaN. The polycrystalline GaN may be then used as a source material for single-crystal growth, for example, by an ammonothermal growth process. This new and non-obvious method will be denoted herein as Hydride Vapor Phase Growth (HVPG). The reactor and method may also be suitable for the formation of other polycrystalline group III nitrides, such as aluminum nitride (AlN), indium nitride (InN) and mixed group III nitrides, such as $Al_xGa_{1-x}N$ or $In_xGa_{1-x}N$ ($0 \leq x < 1$), or $Al_xIn_yGa_{1-x-y}N$ ($0 < x < 1$, $0 < y < 1$). According to the present methods and reactors, the Ga to GaN conversion efficiency increased to over 80%, as shown in the examples provided herein.

According to one embodiment, one method of applying HVPG for the formation of a group III nitride, such as gallium nitride; a group III halide gas, for example, a gallium halide gas such as gallium chloride gas enters a first region of the HVPG reactor. A second nitrogen-containing gas, such as ammonia enters the reactor in a second region of the reactor. The first region and the second region of the reactor are physically separated from one another by a wall or by a sufficient distance to allow the gases to migrate to the growth region without mixing to an appreciable extent or at all.

According to another embodiment, the group III halide gas may be formed by reacting a group III elemental material with a hydrogen halide gas. For example, in one embodiment gallium halide gas ($GaX_z$, where X is halide (i.e., F, Cl, Br, I) and z is an integer from 1-3) may be formed by reacting a gallium source material and a hydrogen halide gas, such as HF, HCl, HBr, or HI, in a first region of the reactor. Any suitable group III elemental material may be used as the source material. For example, for gallium, suitable Ga source material may include, but is not limited to, elemental Ga in metallic, liquid, powder, pellet, granule, wire, or rod form may be used. The hydrogen halide gas may be introduced into the first region of the reactor through an inlet, such as a nozzle. In this instance, the Ga source material, HCl, and the resultant GaCl may all be physically separated from the nitrogen-containing gas (i.e., the $NH_3$ gas) until the GaCl enters a growth region of the reactor.

Thus, one embodiment of the methods of the present disclosure provides a method for producing polycrystalline group III nitride. The method may comprise contacting a gaseous hydrogen halide with a group III element source material in a first heated region to produce group III halide gas, contacting the group III halide gas with a nitrogen containing gas, such as ammonia gas, in a growth region, and producing a crystalline group III nitride, wherein greater than 80% of the total produced group III nitride is polycrystalline group III nitride.

According to one specific embodiment, the group III element may be gallium. In this embodiment, the group III halide gas is therefore, $GaX_z$, where X is a halide (F, Cl, Br, or I) and z is an integer from 1 to 3 and the group III nitride is GaN. In other embodiments, other group III elements such as aluminum or indium or mixtures of gallium with aluminum and/or indium may be used as the group III element source material. For those embodiments where the group III element source material may comprise gallium, suitable Ga source material may include various forms of metallic Ga, such as, for example, liquid Ga, Ga powder, Ga pellets, Ga granules, Ga wire, Ga rods or ingots, or mixtures of any thereof. In those embodiments where the group III source material may comprise aluminum and/or indium, equivalent forms of metallic aluminum or indium may be utilized.

According to one specific embodiment of the method, a gallium source material may be contacted with gaseous hydrogen chloride gas in a first heated region of the reactor. In these embodiments, the temperature of the first heated region may be at least 700° C., for example, at a temperature ranging from 700° C. to 1200° C. For example, the gallium source material may be held within the first heated region of the reactor and the HCl gas may be introduced into the first heated region through a gas inlet such as a nozzle. The gallium source material may then react with the HCl gas to produce a gallium chloride gas, such as $GaCl_z$ where z is an integer from 1-3. The gallium chloride gas may then migrate or move from the first heated region to a growth region. The growth region may be at a temperature of at least 700° C., for example at a temperature ranging from 700° C. to 1300° C. In the growth region, the gallium chloride gas may be contacted with ammonia gas to produce gallium nitride (GaN) vapor. The gallium nitride vapor may then deposit or crystallize in the growth region to form crystalline GaN, wherein greater than 80% of the total produced GaN nay be polycrystalline GaN.

In specific embodiments, greater than 90% of the total produced GaN may be polycrystalline GaN.

In another embodiment, the method may comprise introducing a gallium halide gas, such as a gallium chloride gas into a first heated region and allowing the gallium halide gas to migrate to a growth region. The first heated region may have a temperature of at least 700° C., for example at a temperature ranging from 700° C. to 1200° C. The gallium halide gas may then migrate to the growth region where it is contacted with ammonia gas to produce GaN vapor. The GaN vapor may then deposit or crystallize in the growth region as polycrystalline GaN, such as described before.

In certain embodiments, the growth region may not have any material deposited in it prior to polycrystalline GaN growth. Alternatively, the growth region may contain polycrystalline GaN prior to introducing gallium halide and nitrogen-containing gases. The pre-existing polycrystalline GaN may nucleate additional growth of polycrystalline GaN and/or act as a template for additional growth. In some instances, the use of pre-existing polycrystalline GaN may increase yield of GaN in the reactor. The pre-existing polycrystalline GaN may have had its surface etched prior to introducing it into the growth region, or the pre-existing polycrystalline GaN may be etched once placed in the growth region.

In the present HVPG method, incorporation of impurities into the product polycrystalline group III nitride may increase due to increased growth rate. For example, in traditional HVPE growth of single crystalline GaN, oxygen concentration in single crystalline GaN is at the order of $10^{17}$ atoms/cm$^3$ even though the reactor may be formed from an oxide containing material, such as quartz. On the other hand, polycrystalline GaN grown in a conventional HVPE setup showed oxygen concentration as high as $10^{18}$ atoms/cm$^3$. Without intending to be limited by any theory, it is believed that this may be because polycrystalline group III nitride has more defects and grain boundaries which may act as incorporation sites of oxygen. Therefore, unlike HVPE growth of single crystalline group III nitride, it is preferable to avoid oxygen incorporation during HVPG growth of polycrystalline group III nitride. To remove any possible oxygen source to polycrystalline group III nitride, the HVPG reactors in the present disclosure utilizes non-oxide containing or forming materials, such as e.g. pyrolytic BN components or components formed of other suitable materials not formed of oxides, from which oxygen might be extracted when in direct contact with the hydrogen halide gas, the group III halide gas, and the ammonia NH$_3$ in a heated region or growth region.

For example, impurities may be a larger concern for growth of polycrystalline GaN than for growth of single crystal GaN, since impurity incorporation is significantly greater for growth of polycrystalline material compared to single crystal epitaxial films grown by the traditional HVPE. For example, incorporation of oxygen in the polycrystalline GaN may result in impure polycrystalline GaN material that is less suited for use in other processes, such as ammonothermal growth processes. According to embodiments of the present methods and reactor designs, the impurity and oxide concentration in GaN polycrystals from the HVPG process may be reduced by utilizing oxide-free materials in the growth environment for deposition of polycrystalline GaN. Thus, according to the various methods described herein all interior surfaces in the reactor, such as the first heated region, the second heated region and the growth region, that are in direct contact with the gases may be formed of or coated with a non-oxide material. Alternatively, at least the surfaces of the growth region of the HVPG reactor may be formed of or coated with a material which lacks an oxide from which oxygen may be extracted by the GaN vapor or other gas under the GaN growth conditions and therefore the amount of oxygen incorporated into the growing polycrystalline GaN is greatly reduced or eliminated. According to certain embodiments, the non-oxide material may be, e.g., boron nitride or pyrolytic boron nitride. In specific embodiments, the non-oxide material may be pyrolytic boron nitride. The entire reactor need not be formed of a material that lacks an oxide. For instance, the growth region and optionally the first and/or second heated regions may be formed of a material that lacks an oxide, and the remainder of the HVPG reactor may be formed of conventional materials that may be one or more oxides (such as quartz). Alternatively, surfaces in direct contact with the gases during the HVPG process, such as surfaces in the first heated region and the growth region, may be coated with the non-oxide material.

Embodiments of the present methods provide for the production of polycrystalline group III nitride having an oxygen content quite low, such as less than about $1 \times 10^{19}$ atoms/cm$^3$ or less than $9 \times 10^{18}$ atoms/cm$^3$. In certain embodiments, the oxygen concentration in polycrystalline GaN may be about $8 \times 10^{18}$ atoms/cm$^3$ or lower, or in specific embodiments, at or beneath a detectable limit such as $3.0 \times 10^{16}$ atoms/cm$^3$. According to one embodiment, the oxygen content of polycrystalline GaN may be less than $1 \times 10^{17}$ atoms/cm$^3$. This polycrystalline GaN will have little or no single-crystal GaN associated with it. The polycrystalline GaN also may not incorporate any other of the growth region materials into it and may be about or at or below the limit of detection that exists today for one or more elements that make up the growth region material. For instance, polycrystalline GaN may be grown in a reactor formed from pyrolytic BN. The polycrystalline GaN may have about or at or less than a detectable limit of boron. A detection limit for B is $6.7 \times 10^{15}$ atoms/cm$^3$, and the amount of boron in the polycrystalline GaN may be about this value, at this value, or below this value.

The methods and reactors of the present disclosure provide for the efficient production of polycrystalline group III nitride. According to certain embodiments, the methods described herein may produce the polycrystalline group III nitride, such as polycrystalline GaN, at growth rates of greater than 5 grams per hour (g/hr). In addition, the methods and reactors described herein result in a production efficiency (conversion) where greater than 70% of the group III element source material is converted to polycrystalline group III nitride. For example, in specific embodiments greater than 70% of gallium source material may be converted into polycrystalline GaN and in certain embodiments greater than 80% of the gallium source material may be converted into polycrystalline GaN.

In further embodiments of the methods of the present disclosure, producing the crystalline group III nitride may comprise crystallizing the crystalline group III nitride on a back etched surface of a polycrystalline group III base material. As described herein, in specific embodiments, the polycrystalline group III nitride base material may be recycled polycrystalline group III nitride material from an ammonothermal process. In other embodiments, the polycrystalline group III nitride base material may be pyrolytic boron nitride (BN). In still further embodiments, the polycrystalline group III nitride base material may comprise pyrolytic boron nitride and recycled polycrystalline group III nitride (such as polycrystalline GaN) from an ammonothermal process.

In addition, previously formed polycrystalline GaN may be used as a template or nucleation material to grow polycrystalline GaN as discussed above. For instance, polycrystalline GaN source material formed using HVPG growth as disclosed herein may be heated and maintained at a temperature above 700° C. and back-etched using a hydrogen-containing gas such as $NH_3$ or HCl.

According to certain embodiments, polycrystalline GaN having low oxygen content may be formed by placing previously-formed polycrystalline GaN into the growth region and forming new polycrystalline GaN on the pre-existing polycrystalline GaN. This is especially the case if the pre-existing polycrystalline GaN is etched prior to depositing new polycrystalline GaN in the growth region. Without intending to be limited by any theory, it is theorized that etching may help remove oxygen that may have been incorporated into the previously-grown GaN. The pre-existing polycrystalline GaN may be etched using hydrogen gas or hydrogen containing gas or a combination of the two. In certain embodiments, the pre-existing polycrystalline GaN may be etched using an etching gas, such as, for example, HCl or $NH_3$. The pre-existing polycrystalline GaN may or may not have been formed by a method of this invention and may also include recycled polycrystalline GaN from an ammonothermal growth process.

According to specific embodiments, the pre-existing polycrystalline GaN may be polycrystalline GaN remaining from a single crystal GaN growth process, such as an ammonothermal growth process. Polycrystalline GaN may serve as a source material for an ammonothermal growth process. Typically, in certain ammonothermal growth processes, there may be remaining polycrystalline GaN after the growth process is halted. To increase the overall and economic efficiency of the process for producing single crystal GaN, the remaining polycrystalline GaN may be recycled in the various methods described herein. For example, the recycled or "old" polycrystalline GaN may be introduced into the HVPE process in the growth region to serve as a base material for new polycrystalline GaN growth.

In certain embodiments, the method of the present disclosure may further comprise submitting the polycrystalline group III nitride to an ammonothermal process to produce single-crystal group III nitride. Examples of ammonothermal methods of growing single-crystal GaN may be found in the references incorporated by reference above. Ammonothermal growth processes include solvothermal methods using high-pressure ammonia as a solvent for the growth of high purity and high quality single-crystal group III nitride ingots, suitable for use in various opto-electronic and electronic devices. In the ammonothermal reactor for GaN, a gallium source material, such as polycrystalline GaN is dissolved in supercritical ammonia a source dissolution region. The GaN then flows to a crystal growth region, for example through a series of baffles, and crystallizes to form single crystal GaN. In specific embodiments, due to the retrograde solubility of GaN in supercritical ammonia, the source dissolution region may be at a lower temperature than the crystal growth region.

Further embodiments of the present disclosure provide a method for recycling polycrystalline GaN source material used in a previous ammonothermal growth process. According to these embodiments, the method comprises heating and maintaining the polycrystalline GaN source material at a temperature greater than 700° C., back etching a surface of the polycrystalline GaN source material to provide a back etched polycrystalline GaN, and depositing additional polycrystalline GaN on the surface of the back etched polycrystalline GaN by a hydride vapor phase growth (HVPG) process, such as any of the HVPG processes described herein. The polycrystalline GaN source material from the previous ammonothermal growth process may be back etched according to the process described herein (i.e., contacting the surface with a hydrogen containing gas, such as HCl or $NH_3$). The polycrystalline GaN material that results from the recycling process has a low oxygen content and is suitable for use in a subsequent ammonothermal growth process to produce single crystal GaN ingots. For example, the resulting polycrystalline GaN may have oxygen contents such as those described for the HVPG processed herein, after the recycling process. As previously described, the low oxygen content may result from the back etching of the recycled polycrystalline source material to remove oxide material on the surface of the polycrystalline GaN source material.

Still other embodiments of the present disclosure describe HVPG reactors for growing polycrystalline group III nitride materials, such as, but not limited to, polycrystalline GaN. According to these embodiments, the reactor may comprise a first heated region comprising a first gas inlet configured to introduce a nitrogen containing gas (such as ammonia gas), a second heated region comprising a second gas inlet configured to introduce a halide containing gas, and a growth region in gaseous contact with the first heated region and the second heated region and configured to allow growth of polycrystalline group III nitride (such as GaN). According to these embodiments, the first heated region and the second heated region are configured to maintain separation of the gases in each region. That is, the first and second heated regions are configured so that the nitrogen containing gas and the halide containing gas have no substantial contact with each other until the gases enter the growth region. In specific embodiments, the first heated region, the second heated region and the crystal growth region are each configured to be heated at temperatures ranging from 700° C. to 1200° C. for the first and second heated region and 700° C. to 1300° C. growth region.

Various embodiments of the reactors may be designed so that the growth region, and in certain embodiments both the first heated region and the second heated region, have a surface configured to contact the gases, where the surface is formed from a material other than an oxide (i.e., a non-oxide material). For example, in specific embodiments the reactor surfaces that may contact the gases (i.e., the surfaces of the growth region, the first heated region and/or the second heated region) may be formed from or coated with boron nitride or pyrolytic boron nitride. Surfaces formed from other non-oxide materials are also envisioned. As described herein, use of such non-oxide materials in the reactor design may result in reduced impurity incorporation, such as oxygen incorporation, in the resulting polycrystalline group III nitride.

In one specific embodiment, the second heated region may comprise a second gas inlet configured to introduce $GaCl_z$ (where z is as described herein) as the halide-containing gas. In other embodiments, the second heated region may comprise a second gas inlet configured to introduce a hydrogen halide, such as HCl) as the halide-containing gas may be further configured to contain a gallium source material in contact with the hydrogen halide gas. For example, the second region may be configured to contain a tray made of a non-oxide material that contains a gallium source material and the second gas inlet configured to contact the hydrogen halide gas with the gallium source material in the tray.

In other embodiments of the reactor design, the growth region may be configured to allow back etching of a pre-existing polycrystalline group III nitride material, such as BN and/or GaN. Thus, in certain embodiments, the growth region may be configured to contain a tray made of a non-oxide material containing a pre-existing or recycled polycrystalline group III nitride material. In such embodiments, the growth region may be configured to allow introduction of a hydrogen containing back etching gas (as describe herein, such as HCl or $NH_3$) and allow contact and back etching of a surface of the re-existing or recycled polycrystalline group III nitride material.

Figure 2:
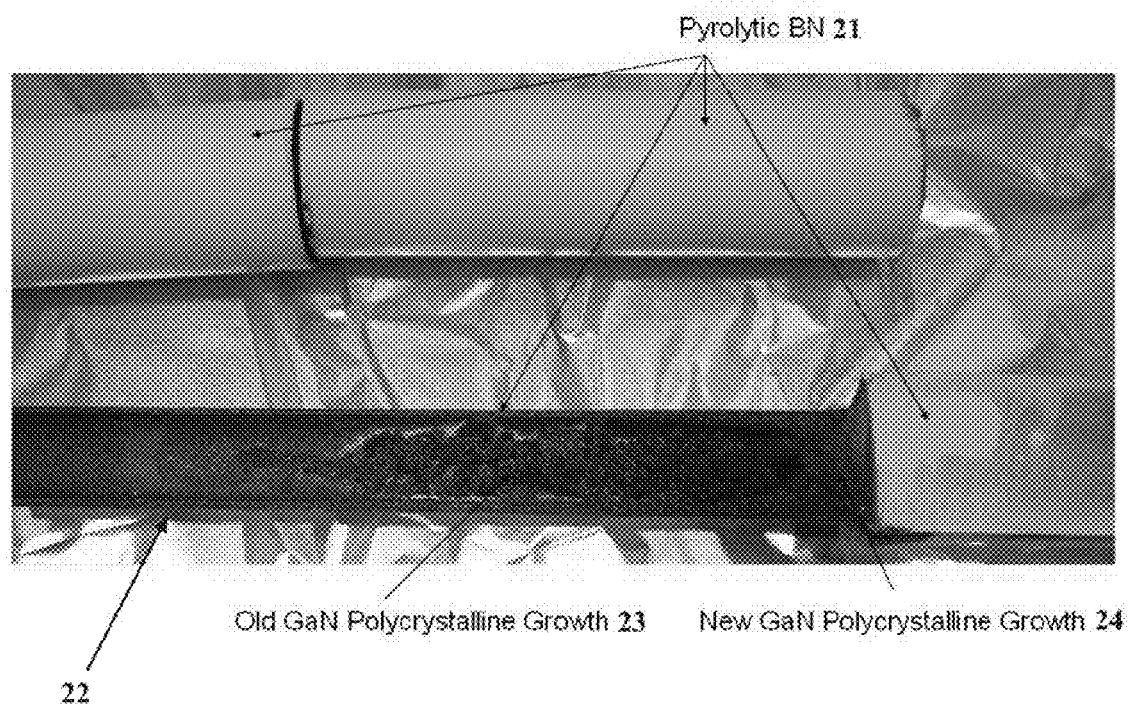
FIG. 2 is an image of a growth region of the HVPG reactor according to one embodiment of the present disclosure. Pyrolytic BN provides the deposition surface for the GaN growth. Recycled GaN and the new GaN growth are labeled.

One exemplary embodiment of an HVPG reactor according to the present disclosure is presented in FIG. 1. Tube reactor 11 includes a heating mechanism 1 surrounded by an insulating material 2. The first heated region 3 includes first gas inlet 4. The second heated region 5 is formed from D-tube 6 inserted into the tube reactor and includes the second gas inlet 7 and a non-oxide tray 8 for containing the group III source material. D-tube 6 prevents gaseous contact between the gas in the first heated region 3 and the gas in the second heated region 5. The gases may then travel to growth region 9 having a liner 10 made from pyrolytic boron nitride (PBN). One skilled in the art will recognize that variations of the reactor design presented in FIG. 1 are possible and are within the scope and intent of the reactors as described herein. One exemplary embodiment of the growth region of a reactor is illustrated in FIG. 2. Pyrolytic boron nitride liners 21 provide a deposition surface for GaN growth. Tray 22 contains recycled polycrystalline GaN material 23 and newly deposited GaN growth 24.

Still other embodiments of the present disclosure include a polycrystalline group III nitride formed by a HVPG process such as described herein. One specific embodiment provides a polycrystalline GaN formed by any of the HVPG methods described herein. The polycrystalline GaN may be suitable for use in an ammonothermal growth process to form single crystal GaN ingots of high purity and high quality and suitable for use in various opto-electronic and electronic applications.

Further embodiments describe methods of forming single-crystal GaN. The methods may comprise forming polycrystalline GaN by a hydride vapor phase growth process such as any of the methods disclosed herein; utilizing the polycrystalline GaN as a nutrient or gallium source material in an ammonothermal growth process to grow single-crystal GaN; and forming single crystal GaN by the ammonothermal growth process. Examples of ammonothermal methods of growing single-crystal GaN may be found in the references incorporated by reference above, and thus any method of forming single-crystal GaN as disclosed in those references may utilize polycrystalline GaN grown by any method disclosed herein. Also disclosed is single-crystal GaN made by this method.

In another embodiment the method of forming single crystal GaN may further comprise the step of recycling polycrystalline GaN source material remaining after completion of the ammonothermal growth process in a subsequent hydride vapor phase growth process. As recited herein, by recycling unused or remaining polycrystalline GaN source material that is not consumed during the ammonothermal growth process, the overall economic efficiency of the ammonothermal process for producing group III nitrides may be improved.

The methods and reactors disclosed herein may be used to form polycrystalline $Al_xGa_{1-x}N$, $In_xGa_{1-x}N$, and $Al_xIn_yGa_{1-x-y}N$ ($0<x<1$, $0<y<1$). Further, the polycrystalline material formed by methods disclosed herein may be used to make single-crystal $Al_xGa_{1-x}N$, $In_xGa_{1-x}N$, and $Al_xIn_yGa_{1-x-y}N$ by any of the methods of forming these single-crystal materials, including those methods incorporated by reference herein.

In the following Examples of various exemplary embodiments, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

EXAMPLES

The following text describes non-limiting examples of the current invention.

Example 1

Production of GaN Polycrystals in HVPG

In this example, a tube furnace with an inner diameter of 2" was used for the HVPG growth. FIG. 1 is a schematic drawing of the HVPG reactor. 110.0 g of Ga source material was loaded into a pyrolytic BN tray or boat (FIG. 1, feature 8) which in turn was loaded into a D-tube (FIG. 1, feature 6) which allowed gas streams to be separated in the growth reactor. Several pyrolytic BN parts or liners (FIG. 1, feature 10) were loaded in the growth region (FIG. 1, feature 9) of the reactor to act as the deposition surface. The reactor was then sealed and connected to a gas/vacuum system, which could pump down the vessel as well as can supply $NH_3$, HCl, and $N_2/H_2$ to the reactor. The reactor was evacuated and refilled 3 times to remove any oxygen. The reactor was heated to 1100° C. as measured by thermocouples at the growth region while it was purged with a $N_2/H_2$ mixture. Once the growth temperature was reached, $NH_3$ and HCl gas flows were added to the reactor (FIG. 1, features 4 and 7, respectively). The HCl gas flowed through the lower nozzle 7 and into in the D-tube 6 where the gas could react with Ga in the Ga tray or boat 8 to form GaCl which was then transported to the growth environment or region 9, and $NH_3$ gas flowed through the upper gas nozzle 4 such that the GaCl and $NH_3$ gases contacted one another in growth region 9. After 7 hours the growth was stopped and the reactor opened upon cooling. Polycrystalline GaN growth and Ga metal consumption were measured as 108.2 g and 107.3 g, respectively. The molar weight of Ga and GaN is 69.72 g/mol and 83.73 g/mol, respectively. If all consumed Ga is turned into GaN, the theoretical GaN weight is estimated to be 128.9 g. Therefore, Ga to GaN conversion efficiency was approximately 84% in this example.

Secondary Ion Mass Spectroscopy confirmed the bulk concentrations of impurities as listed in Table 1. The B incorporation level at the detection limit at the initial growth surface indicates that the pyrolytic BN is stable and not incorporating into the polycrystalline GaN grown in the reactor.

TABLE 1

| | Bulk Concentrations (atoms/cm³) | | |
|---|---|---|---|
| | O | Si | B |
| Polycrystalline GaN | $8.10 \times 10^{18}$ | $2.30 \times 10^{17}$ | $5.90 \times 10^{15}$ |
| Detection limit | $3.00 \times 10^{16}$ | $1.00 \times 10^{15}$ | $6.70 \times 10^{15}$ |

Example 2

Polycrystalline GaN Recycling Process

In this example, a tube furnace with an inner diameter of 2" was used for the HVPG growth. 110.0 g of Ga source material was loaded into a pyrolytic BN tray 8 of FIG. 1 which in turn was loaded into a D-tube 6 which allowed gas streams to be separated in the growth reactor. Several pyrolytic BN parts were loaded in the growth region of the reactor to act as the deposition surface. As illustrated in FIG. 2, 30.0 g of old GaN source material 23 remaining from a series of ammonothermal experiments ("old GaN polycrystalline growth") was also loaded onto a pyrolytic BN tray and placed in the growth region 9 of FIG. 1. The source material had been rinsed with DI water and baked after unloading from the ammonothermal autoclave. The reactor was then sealed and connected to a gas/vacuum system, which could pump down the vessel as well as can supply $NH_3$, HCl, $N_2/H_2$ to the reactor. The reactor was evacuated and refilled 3 times to remove any oxygen. The reactor was heated to 1100° C. as measured by thermocouples at the growth region while purged with a $N_2/H_2$ mixture. Once the growth temperature was reached, $NH_3$ and HCl gas flows were added to the reactor. The HCl gas flowed into the D-tube where it can react with the Ga to form GaCl which was transported to the growth environment 9. After 7 hours the growth was stopped and the reactor opened upon cooling down. The polycrystalline GaN growth and Ga metal consumption were measured as 108.1 g and 103.4 g respectively. Similar to Example 1, Ga to GaN conversion efficiency was calculated to be approximately 87%, which showed slight increase from Example 1. This is likely due to the increase in possible growth surface area provided by the old GaN 23. An image of the old and new polycrystalline growth (23 and 24, respectively) is shown in FIG. 2.

Advantages and Improvements

The present invention disclosed new production methods of polycrystalline GaN for use in the ammonothermal growth of group III-nitride material. Quantities over 100 g of polycrystalline GaN with low impurity concentration can be consistently produced in times of 7 hours. Additionally any remaining GaN source material from previous ammonothermal growth can be recycled providing additional future source material. These methods improve production rates to produce polycrystalline GaN optimized for use in the ammonothermal growth of III-nitride material.

The following describes some alternative embodiments for accomplishing the present invention.

In the preferred embodiment, specific growth apparatuses and the use of pyrolytic BN are presented. However, other constructions or designs that fulfill the conditions described herein will have the same benefit as these examples.

The present invention does not have any limitations on the size of the reactor or the amount recycled or grown, so long as the same benefits can be obtained.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for producing polycrystalline group III nitride comprising: (a) contacting a gaseous hydrogen halide with a group III element source material in a first heated region to produce a group III halide gas; (b) contacting the group III halide gas with ammonia gas in a growth region, the gaseous group III halide gas migrating from the first heated region to the growth region; and (c) producing a crystalline group III nitride in the growth region positioned downstream of the first heated region, wherein greater than 80% of the total produced group III nitride is polycrystalline group III nitride.

2. The method of claim 1, wherein the group III element is Ga; the group III halide gas is $GaX_z$, where X is a halide and z is an integer from 1 to 3; and the group III nitride is GaN.

3. The method of claim 1, wherein the hydrogen halide is hydrogen chloride.

4. The method of claim 2, wherein the Ga source material is selected from the group consisting of metallic Ga, liquid Ga, Ga powder, Ga pellets, Ga granules, Ga wire, Ga rods and mixtures of any thereof.

5. The method of claim 2, wherein at least 90% of the total produced GaN is polycrystalline GaN.

6. The method of claim 1, wherein all surfaces in direct contact with the gases in one or both of the first heated region and the growth region are of a non-oxide material.

7. The method of claim 6, wherein the non-oxide material is pyrolytic boron nitride.

8. The method of claim 1, wherein the oxygen content of the polycrystalline group III nitride is less than $10^{19}$ atoms/$cm^3$.

9. The method of claim 1, wherein the oxygen content of the polycrystalline group III nitride is less than $10^{17}$ atoms/$cm^3$.

10. The method of claim 1, wherein the temperature of the first heated region and the temperature of the growth region are greater than 700° C.

11. The method of claim 1, wherein the polycrystalline group III nitride is produced at a rate of greater than 5 g/hr.

12. The method of claim 1, wherein greater than 70% of the group III element source material is converted to polycrystalline group III nitride.

13. The method of claim 1, wherein producing the crystalline group III nitride comprises crystallizing the crystalline group III nitride on a back etched surface of a polycrystalline group III nitride base material.

14. The method of claim 13, wherein the polycrystalline group III nitride base material comprises recycled polycrystalline group III nitride from an ammonothermal process.

15. The method of claim 13, wherein the polycrystalline group III nitride base material is pyrolytic boron nitride.

16. The method of claim 13, wherein the polycrystalline group III nitride base material comprises pyrolytic boron nitride and recycled polycrystalline group III nitride from an ammonothermal process.

17. The method of claim 1, further comprising: submitting the polycrystalline group III nitride to an ammonothermal process to produce single-crystal group III nitride.

18. A reactor for growing polycrystalline GaN comprising: a first heated region comprising a first gas inlet configured to introduce a nitrogen-containing gas; a second heated region comprising a second gas inlet configured to introduce a Ga halide-containing gas, the first heated region and the second heated region being configured to maintain separation of the gases in each region; and a growth region downstream of the first heated region and the second heated region, the growth region being in gaseous contact with the first heated region and the second heated region and configured to allow growth of polycrystalline GaN.

19. The reactor of claim 18, wherein the growth region has a surface configured to contact the gases and formed of a material other than an oxide.

20. The reactor of claim 19, wherein the material comprises pyrolytic boron nitride.

21. The reactor of claim 18, wherein the halide-containing gas comprises HCl.

22. The reactor of claim 21, wherein the second heated region is further configured to contain a gallium source material in contact with the halide containing gas.

23. The reactor of claim 18, wherein the halide-containing gas comprises $GaCl_z$ where z is an integer from 1-3.

24. Polycrystalline GaN formed by the method of claim 1.

25. The method of claim 13, wherein the group III element is Ga; the group III halide gas is $GaX_z$, where X is a halide and z is an integer from 1 to 3; and the group III nitride is GaN.

26. The method of claim 13, wherein the hydrogen halide is hydrogen chloride.

27. The method of claim 25, wherein the Ga source material is selected from the group consisting of metallic Ga, liquid Ga, Ga powder, Ga pellets, Ga granules, Ga wire, Ga rods and mixtures of any thereof.

28. The method of claim 25, wherein at least 90% of the total produced GaN is polycrystalline GaN.

29. The method of claim 13, wherein all surfaces in direct contact with the gases in one or both of the first heated region and the growth region are of a non-oxide material.

30. The method of claim 29, wherein the non-oxide material is pyrolytic boron nitride.

31. The method of claim 13, wherein the oxygen content of the polycrystalline group III nitride is less than $10^{19}$ atoms/$cm^3$.

32. The method of claim 13, wherein the oxygen content of the polycrystalline group III nitride is less than $10^{17}$ atoms/$cm^3$.

33. The method of claim 13, wherein the temperature of the first heated region and the temperature of the growth region are greater than 700° C.

34. The method of claim 13, wherein the polycrystalline group III nitride is produced at a rate of greater than 5 g/hr.

35. The method of claim 13, wherein greater than 70% of the group III element source material is converted to polycrystalline group III nitride.

36. The reactor of claim 18, wherein the first and second heated regions are positioned in a first portion of a chamber of the reactor, the growth region is positioned in a remaining portion of the chamber of the reactor, and the first portion of the chamber is separated from the remaining portion to prevent having a mixture of the nitrogen-containing gas and the halide-containing gas in the first portion of the chamber.

37. The method of claim 1, wherein the first heated region comprises a first portion of a chamber of a reactor, the growth region is positioned in a remaining portion of the chamber of the reactor, wherein the ammonia gas and a halide gas comprised of at least one of the hydrogen halide gas and the group III halide gas are heated in said first portion of the chamber, and the remaining portion of the chamber is separated from said first portion of the chamber to prevent having a gas mixture in said first portion of the chamber, said gas mixture being comprised of the ammonia gas and the halide gas.

* * * * *